United States Patent [19]

Fukui et al.

[11] Patent Number: 5,064,744
[45] Date of Patent: Nov. 12, 1991

[54] PHOTOSENSITIVE MATERIAL AND IMAGE FORMING METHOD

[75] Inventors: Tetsuro Fukui; Hiroshi Fukumoto, both of Kawasaki; Masato Katayama, Yokohama; Kozo Arahara, Kawasaki; Kenji Kagami, Atsugi, all of Japan

[73] Assignee: Canon Kabushiki Kaisha, Tokyo, Japan

[21] Appl. No.: 477,124

[22] Filed: Feb. 7, 1990

Related U.S. Application Data

[63] Continuation of Ser. No. 314,141, Feb. 23, 1989, abandoned.

[30] Foreign Application Priority Data

Feb. 26, 1988 [JP] Japan ................................ 63-42185

[51] Int. Cl.$^5$ .............................................. G03C 1/72
[52] U.S. Cl. ..................................... 430/255; 430/138; 430/200; 430/202; 430/253; 430/254; 430/617
[58] Field of Search ............... 430/138, 200, 202, 253, 430/254, 255, 256, 263, 264, 270, 281, 327, 328, 330, 502, 617

[56] References Cited

U.S. PATENT DOCUMENTS

| 4,624,910 | 11/1986 | Takeda | 430/328 |
| 4,629,676 | 12/1986 | Hayakawa et al. | 430/330 |
| 4,764,451 | 8/1988 | Ishikawa | 430/254 |
| 4,824,756 | 4/1989 | Nakamura | 430/281 |

FOREIGN PATENT DOCUMENTS

| 254181 | 1/1988 | European Pat. Off. | 430/254 |
| 70836 | 4/1987 | Japan . | |

Primary Examiner—Hoa Van Le
Attorney, Agent, or Firm—Fitzpatrick, Cella, Harper & Scinto

[57] ABSTRACT

A photosensitive material comprises a photosensitive and heat-developable element and a photopolymerizable element which are contained in the same layer. The photopolymerizable element comprises at least a polymerizable polymer precursor having a melting point of 35° C. or more. The photosensitive material is exposed to light with at least one wavelength within the wavelength region of from 400 nm to 900 nm, heated at 60° to 180° C., and exposed to light with at least one wavelength within the wavelength region of from 250 to 700 nm, and thus an unexposed area in the photosensitive layer which is an area not exposed to light with at least one wavelength within the wavelength region of from 400 nm to 900 nm is polymerized.

15 Claims, 4 Drawing Sheets

PHOTOSENSITIVE MATERIAL AND IMAGE FORMING METHOD

This application is a continuation of application Ser. No. 314,141 filed Feb. 23, 1989, now abandoned.

BACKGROUND OF THE INVENTION

1. Field of the Invention

The present invention relates to a photosensitive material that forms a polymer image by heating or exposure to light, and an image forming method which employs the photosensitive material.

2. Related Background Art

Energies used to form or record an image include light, sound, electricity, magnetism, heat, radiations such as electron rays and X-rays, and chemical energy, among which, in particle, widely used are light, electricity, heat energy, or a combination of any of these.

For example, the image forming method that employs the combination of light energy with chemical energy includes a silver salt photographic process and a method in which a diazo copying paper is used. The method that employs the combination of light energy with electric energy includes an electrophotographic system. Also, the method that utilizes heat energy includes a method in which a thermal recording paper or transfer recording paper is used. On the other hand, known as the method that utilizes electric energy is a method in which an electrostatic recording paper, electrothermal recording paper, or electrosensitive recording paper is used.

Of the above image forming methods, the silver salt photographic process can obtain an image having an high resolution. The silver salt photographic process, however, requires the developing and fixing that uses complicated liquid compositions, and the drying of an image (or a print).

Now, development is energetically made on image forming methods that can form an image through a simple processing.

For example, U.S. Pat. No. 4,629,676 teaches a method in which polymerization reaction under dry (thermal) conditions is caused by the photosensitive reaction of silver halide that acts as a trigger, to form an image comprising a polymer.

This method has the advantage that any complicated wet processing is not required, but has had the disadvantage that the polymer formation rate (i.e., polymerization rate of a polymeric compound) is so low that it takes a long time to form the polymer image. Incidentally, this disadvantage arises presumably because of a reaction intermediate (which functions as a polymerization initiator) formed, in the course of heating, by the reaction between silver produced from silver halide by imagewise exposure and a reducing agent, which intermediate is considered to be so stable and has so low activity as the polymerization initiator that the polymerization reaction can not proceed so rapidly.

On the other hand, to cope with this problem to accelerate the polymerization, Japanese Unexamined Patent Publication No. 62-70836 discloses a method in which a thermal polymerization initiator is used.

This method comprises forming a latent image comprising silver metal produced from silver halide by imagewise exposure, converting, by utilizing a catalytic action of the above silver metal and under heating, a reducing agent into an oxidized product having a polymerization inhibitory power different from that of said reducing agent, thereby producing a difference in the polymerization inhibitory power between the reducing agent and the resulting oxidized product and also causing a thermal polymerization reaction utilizing the thermal polymerization initiator, thus forming a polymer image in accordance with the difference in the polymerization inhibitory power.

This method, however, has been accompanied with the disadvantage that a good contrast can be made with difficulty in the polymer image.

This disadvantage arises presumably because the oxidation-reduction reaction takes place in a latent image portion to form the oxidized product and the polymerization reaction to form the polymer image are allowed to take place in the same heating step, so that these reactions may proceed in a competitive fashion and thus the respective reactions may not proceed in a good efficiency.

Also, the image formation according to this method is very unstable in that, for example, the areas on which the polymer is formed may turn into exposed areas or unexposed areas even because of a slight change in the amount of the reducing agent.

In addition, U.S. Pat. No. 4,649,098 discloses a method in which a reducing agent having a polymerization inhibitory power is brought into an oxidized product by imagewise consumption thereof, that is, imagewise oxidation (at imagewise exposed areas) in the course of the developing of silver halide, and, after imagewise inhibition (at imagewise unexposed areas) of polymerization reaction by the action of the residual reducing agent, light energy is uniformly applied onto the whole area from outside to cause photopolymerization at the part where the reducing agent has been consumed, thus forming a polymer image.

The above method has the advantages that it can achieve a high sensitivity in the writing of a latent image since the silver halide is utilized, and the steps of from the writing for the formation of an image up to the whole areal exposure can be separated in a good efficiency. It, however, is difficult to obtain a polymer image having a sufficient contrast. This is caused for the following reason.

The reducing agent used in the above method is in itself a reducing agent that acts as a polymerization inhibitor and ceases to act as the polymerization inhibitor after the reduction of silver halide. Hence the reducing agent at the imagewise exposed area must be sufficiently converted into the oxidized product, in order that the polymerization may be sufficiently achieved. However, the application of heat energy in a sufficient amount upon carrying out the development, with the intention to sufficiently convert the reducing agent at the imagewise exposed area into the oxidized product, may cause an unauthorized oxidation-reduction reaction at the imagewise unexposed areas. On the other hand, the application of heat energy upon a reduced amount in carrying out the development, with the intention to prevent the oxidation-reduction from taking place at the imagewise unexposed area, may conversely make the oxidation-reduction reaction not to sufficiently proceed at the exposed areas. Since in this instance the imagewise exposed area of an oxidation-reduction image is polymerized with difficulty, the light energy in carrying out the whole areal exposure must be applied in an increased amount. This may cause an unauthorized polymerization at the unexposed areas with increase in the amount thereof, eventually making it impossible to obtain the polymer image with a sufficient contrast.

The polymer image to be formed according to the methods as described above is an image comprising a polymerized area and an unpolymerized area. Aiming at making this polymer image visible and further forming it into a color image, U.S. Pat. No. 4,649,098 and so forth disclose various methods that utilize the difference in physical properties and so forth between the polymerized area and unpolymerized area. For example, proposed are a method in which a treatment is made using a liquid that does not dissolve the polymerized area and dissolves the layer of the unpolymerized area, to dissolve out and remove the unpolymerized area (i.e., etching); a method in which, utilizing a difference in adhesion between the polymerized area and unpolymerized area, a sheet such as a plastic film is adhered and thereafter peeled to separate the polymerized area from unpolymerized area under dry conditions (i.e., peeling-apart); in the case that the polymer image is formed into a color image, a method in which a photopolymerizable layer is previously colored with use of a pigment or dye, which is then subjected to dissolving-out (i.e., the above etching) or peeling (i.e., the above peeling-apart) to form the color image, or a method in which, utilizing the adhesion at the unpolymerized area, a coloring powder is applied to make selective coloring (i.e., toning or inking), or, utilizing a difference in liquid-permeability between the polymerized area and unpolymerized area, the unpolymerized area and selectively dyed by treating it with a dye solution.

However, no polymer image having a sufficient contrast can be obtained in the conventional polymer image forming methods as discussed above, and hence, even with employment of any of the above methods for making the image visible or forming it into a color image, the visible image and color image which are obtained from such a polymer image can not have any sufficient contrast, and particularly it has been difficult to obtain highly detailed visible image and color image.

To cope with the above, the present inventors has ever proposed a photosensitive composition, a photosensitive material, and an image forming method, in which an oxidized product having a polymerization inhibitory power is formed by exposure to light and heating, and thereafter a polymer image is formed at an imagewise unexposed area (U.S. patent application filed Jan. 29, 1989, based on Japanese Patent Application Nos. 63-17155, 63-18502, 63-183441, 63-251958 and 1-1153).

SUMMARY OF THE INVENTION

An object of the present invention is to provide a photosensitive composition and a photosensitive material that form a polymer image at the above imagewise unexposed area, and a photosensitive material that form a polymer image at the above imagewise unexposed area, and a photosensitive composition and a photosensitive material that have a good green storage stability and also can form an image with a high resolution.

Here, "green storage" indicates that the photosensitive composition or material is stored as it is, until it is subjected to image-exposure.

Another object of the present invention is to provide an image forming method, comprising forming a polymer image on a photosensitive material in which a photosensitive composition having achieved the above subject may have been dispersed in a microcapsular state, and thereafter transferring an unpolymerized area to an image receiving paper to form a color image (hereinafter described as "the capsule method"), which is an image forming method that can obtain an image with a good resolution.

The present invention that can achieve the above objects provides a photosensitive composition containing at least one of a photosensitive silver salt, a reducing agent and a polymerizable polymer precursor, wherein the polymerizable polymer precursor comprises at least one having a melting point of 35° C. or more, and said reducing agent comprises at least one of the compounds represented by Formula (I), (II) and (III), described later; and the photosensitive material comprising the photosensitive composition which may be contained therein in a microcapsular state.

The present invention also provides an image forming method, comprising subjecting the above photosensitive material to imagewise exposure to form a latent image originating from the photosensitive silver salt and/or reducing agent, and thereafter, utilizing said latent image, causing polymerization to proceed at an imagewise unexposed area to form a polymer image, and also an image forming method, comprising transferring a substantially unpolymerized area to an image receiving medium by heating and pressing.

DETAILED DESCRIPTION OF THE PREFERRED EMBODIMENTS

Figure 1A:
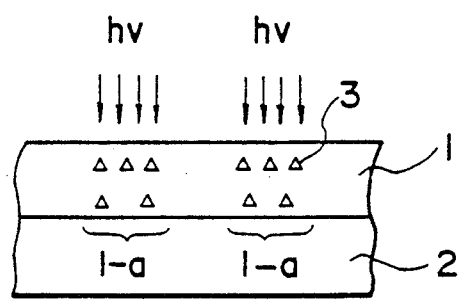
FIGS. 1A, 1B, and 1C and FIGS. 2A, 2B and 2C are diagrammatical cross sections to illustrate respective steps in the image forming method of the present invention.

The photosensitive composition and photosensitive material of the present invention contain a polymerizable polymer precursor having a melting point of 35° C. or more, and at least one of the compounds represented by Formulas (I), (II) and (III).

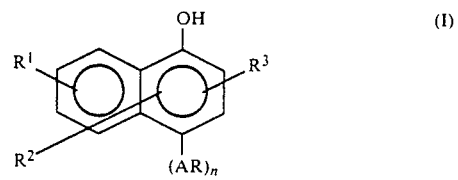

(I)

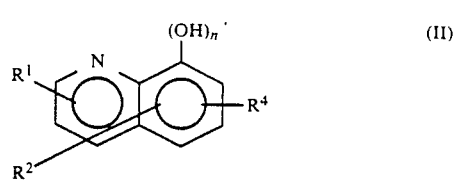

(II)

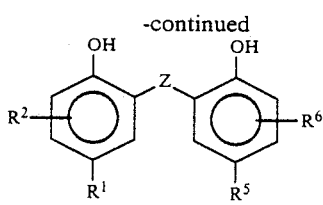

(III)

In the above Formulas (I), (II) and (III), $R^1$, $R^2$, $R^3$, $R^5$ and $R^6$ each independently represent a hydrogen atom, a halogen atom, a hydroxyl group, a substituted or unsubstituted alkyl group, a substituted or unsubstituted aralkyl group, a substituted or unsubstituted aryl group, an alkoxyl group, or a substituted or unsubstituted cycloalkyl group; $R^4$ represents a hydrogen atom, a halogen atom, a substituted or unsubstituted alkyl group, a substituted or unsubstituted aralkyl group, a substituted or unsubstituted aryl group, a substituted or unsubstituted cycloalkyl group, a carboxyl group, or a carboxylic acid ester group; A represents an oxygen atom, or a sulfur atom; R represents a hydrogen atom, an unsubstituted alkyl group, or a substituted or unsubstituted aralkyl group; n represents 0 or 1; and Z is a divalent linking group and represents an alkylidene group, an aralkylidene group, or a sulfur atom.

Using a photosensitive material having a photosensitive layer made of this photosensitive composition, a good image which is free of image unclearness is formed by carrying out the method disclosed in Japanese Unexamined Patent Publications No. 62-78552 and No. 62-81635, i.e. the method in which a polymerizable polymer is formed using a silver salt, and in which, for the purpose of obtaining an end color image, an image originating from a difference in breaking strength of capsules between the polymerizable polymer formed area and unformed area is transferred to an image receiving medium by heating and pressing.

However, the photosensitive composition of the present invention can be not only applied in the method disclosed in the Japanese Unexamined Patent Publications No. 62-78552 and No. 62-81635 but also applied in a method of forming a color image or a polymer image by the etching, peeling-apart, or toning and inking after polymerization treatment, where it is possible to obtain an image with a good green storage stability and an excellent resolution.

More specifically, the photosensitive composition of the present invention enables suppression of the dark reaction during the green storage, has eliminated the problems of blocking since the photosensitive layer has been improved to become non-sticky, and also enables suppression of a strain produced in the photosensitive layer upon carrying out the heat treatment, so that the polymer image and color image with a high resolution can be obtained.

Other advantages of the present invention will be described for each image forming method. In instances in which the capsule method is used, it is possible to suppress an image from spreading when the unpolymerized area is transferred to the image receiving medium, and simultaneously to obviate the problem of unpleasant odor that may occur when a polymerizable polymer precursor having a melting point of less than 35° C. has been usually used. It is also possible to improve the storage stability of the image once having been transferred to the image receiving medium. More specifically, it becomes possible to eliminate the discoloration problem that a color image is reversely reacted with a leuco dye, which may occur when the polymerizable polymer precursors described in the Japanese Unexamined Patent Publications No. 62-78552 and No. 62-81635 are used, or lessen the image unclearness that may be caused by the spreading of the polymerizable polymer precursor in the image receiving medium during the storage of images. In instances in which the inking and toning were applied, the advantage of ease in handling is brought about because the polymer image formed is not sticky.

In instances in which the peeling-apart is applied, it becomes possible to stably obtain a peeled image since the cohesive failure, which used to occur in the photosensitive layer because of differences in operation environments, has been decreased.

As described above, the present invention was found to have various advantages in addition to the improvement in green storage stability and improvement in resolution.

In the present invention, the "melting point" refers to the temperature at which a substance in a crystalline or solid state is melted or softened, or the temperature at which a substance in a waxy state is melted to turn into a transparent state.

The reason why the storage stability is improved by using the polymerizable polymer precursor having a melting point of 35° C. or more is not clear, but presumably because of the following:

1. Because of less moisture absorption, the dark reaction between the silver salt and the reducing agent of the present invention proceeds with difficulty.
2. The hydrogen bond between the urethane group or ester group of the polymerizable polymer precursor and the hydroxyl group of the reducing agent results in the existence of the reducing agent in a stable stage, and hence the dark reaction proceeds with difficulty.

Also the reason why the resolution is improved is presumably that the strain of the photosensitive layer is lessened in carrying out the heating, and, in addition thereto, probably that employment of the polymerizable polymer precursor having a melting point of 35° C. or more influences the oxidation-reduction reaction between the silver salt and the reducing agent of the present invention.

The present invention may have been achieved by the facts other than the above, but it is not an objective of the present application to investigate the reasons.

The means of polymerization in the present invention should rely on a method in which a polymer image is formed in the imagewise unexposed area by either thermopolymerization or photopolymerization, and preferably by photopolymerization in view of the goodness in contrast.

In a preferred embodiment, the photosensitive material contains a silver halide and a photopolymerization initiator. In such an embodiment, the photosensitive material is subjected to imagewise exposure under an energy of up to 1 mJ/cm² at maximum, through a mask having an optical density of 3.0 or more at the masked portion, and using the light having a wavelength to which the silver halide has a sensitivity, as exemplified by light of 400 nm or less in the case that the silver halide comprises silver chloride and has not been sensitized, light of 450 nm or less in the case that the silver halide comprises silver bromide and has not been sensitized, light of 480 nm or less in the case that the silver halide comprises silver iodobromide and has not been sensitized, and light within the sensitizing region in the case that the silver halide has been sensitized (e.g., light of about 900 nm or less when it has been infrared-sensitized); and then subjected to heating at temperatures of from 60° C. to 180° C., and preferably from 100° C. to 150° C., for a time of from 1 second to 5 minutes, and preferably from 3 seconds to 60 seconds, by use of a hot plate, a heat roller or the like. At this stage, an optical image may be formed or may not be formed on the imagewise exposed area. Thereafter, the whole areal exposure is applied under an energy of 500 J/cm$^2$ at maximum and using the light having a wavelength to which the photopolymerization initiator has a sensitivity in the instance of the photopolymerization, e.g., light of from 250 nm to 700 nm, and more preferably from 300 nm to 500 nm, whereupon the imagewise unexposed area is polymerized.

In the instance of the thermopolymerization, such heating is carried out at 70° to 180° C., and preferably 80° to 150° C., for 1 to 100 seconds. The heating treating described above may be substituted for this heating, or this heating may be carried out afresh.

The photosensitive composition of the present invention will be described below in greater detail.

The polymerizable polymer precursor contained in this photosensitive composition may preferably be a bifunctional greater compound in view of the sensitivity, and one or two or more kinds thereof can be used.

In the instance where the capsule method is used, the polymerizable polymer precursor is required to be a compound that may bring the unpolymerized area into substantial melting, or show a tackiness enough for that area to be transferred, in accordance with the state of heating in carrying out the transfer.

Polymerizable polymer precursors comprised of a polymer having a polymerizable functional chain on its side chain are not preferred since the precursors, many of which are solid at room temperature, do not melt even under a heated state, or difficult to contrast with the unpolymerized area even if the polymerization takes place.

In particular, in the instance of the etching, inking, toning, and peeling-apart, the polymerizable polymer precursors comprised of a polymer having a polymerizable functional chain on its terminal are not preferred since differences in the solvent solubility, adhesion and stickiness between the polymerized and unpolymerized areas cause difficulties.

Also in the instance where the capsule method is utilized, the polymerizable polymer precursor may preferably have a melting point of 140° C. or less for the reason that the transfer must be achievable on the image receiving medium at temperatures lower than the oxidation-reduction reaction temperature.

Polymerizable polymer precursors of an acrylamide type as exemplified by acrylamide, methylenebisacrylamide and ethylenebisacrylamide are also unsuitable to a method in which they are incorporated, in a capsular state or oil-droplet state into an image forming layer. This is because they are soluble in water.

The polymerizable polymer precursor used in the present invention includes bifunctional or more polyester acrylate or polyurethane acrylate, and also include ester condensates of hexamethylene glycol, octamethylene glycol, decamethylene glycol, dodecamethylene glycol or trimethylol propane with acryloxyactic acid or acyryloxpropionic acid, and reaction products of cyclohexylenediisocyanate, 4,4'-methylenebis(cyclohexylisocyanate), 1,4-cyclohexylenemethylenediisocyanate or phenylenediisocyanate with hydroxyalkylacrylate or hydroxyalkoxyalkylacrylate. Sepecific examples thereof are set out below, but said polymer precursors are by no means limited to these.

Bis{4-[2-acryloxy)ethyoxycarbamoyl]cyclohexyl}methane (m.p. 126°–129° C.), bis {4-[2-acryloxy)ethoxycarbamoyl]phenyl}methane (m.p. 75°–78° C.), 1,6-bis[2-(acryloxy)acetoxy]hexane (m.p. 63°–65° C.), 1,12-bis[2-(acryloxy)acetoxy]dodecane (m.p. 70°–72° C.), 1,4-bis[2-(acryloxyacetoxy)ethoxycarbamoylmethyl]cyclohexane (m.p. 104°–106° C.), 1,3-bis[2-acryloxyacetoxy)ethoxycarbamoylmethyl]benzene (m.p. 67°–70° C.), bis{4-[2-(acryloxyacetoxy)isopropoxycarbamoyl]phenyl}methane (m.p. 71°–74° C.), 2,4-bis[2-(acryloxy)ethoxycarbamoyl]toluene (m.p. 75°–77° C.), 2,4-bis[2-(acryloxyacetoxy) ethoxycarbamoyl]toluene (m.p. 72°–74° C.), 1,6-bis[2-(acryloxyacetoxy)ethoxycarbamoyl]hexane (m.p. 125°–127° C.), and bis{4-[3-(acryloxy)propoxycarbamoyl]cyclohexyl}methane (m.p. 51°–55° C.).

It is also possible to use a polymerizable polymer precursor having a melting point of less than 35° C. in combination with the above compounds, so long as the present invention does not deviate from what is the objective.

Such polymerizable polymer precursor may include monovalent monomers as exemplified by styrene, methylstyrene, chlorostyrene, bromostyrene, methoxystyrene, dimethylaminostyrene, cyanostyrene, aminostyrene, acrylic acid, methyl acrylate, ethyl acrylate, cyclohexyl acrylate, methacrylic acid, methyl methacrylate, ethyl methacrylate, propyl methacrylate, butyl methacrylate, phenyl methacrylate, cyclohexyl methacrylate, N-vinylimidazole, N-methyl-2-vinylimidazole, propyl vinyl ether, butyl vinyl ether, isobutyl vinyl ether, $\beta$-chloroethyl vinyl ether, phenyl vinyl ether, p-methylphenyl vinyl ether and p-chlorophenyl vinyl ether; divalent monomers as exemplified by divinylbenzene, oxalic acid di(ethyl acrylate), oxalic acid di(methyl ethyl acrylate), malonic acid di(ethyl acrylate), malonic acid di(methyl ethyl acrylate), succinic acid di(ethyl acrylate), glutaric acid di(ethyl acrylate), adipic acid di(ethyl acrylate), maleic acid di(ethyl acrylate), fumaric acid di(ethyl acrylate), $\beta,\beta'$-dimethylglutaric acid di(ethyl acrylate), oxalic acid di(ethyl methacrylate), oxalic acid di(methyl ethyl methacrylate), malonic acid di(ethyl methacrylate), malonic acid di(methyl ethyl methacrylate), succinic acid di(ethyl methacrylate), succinic acid di(methyl ethyl methacrylate), glutaric acid di(ethyl methacrylate), adipic acid di(ethyl methacrylate), maleic acid di(ethyl methacrylate), fumaric acid di(methyl ethyl methacrylate), and $\beta,\beta'$-dimethylglutaric acid di(ethyl methacrylate); trivalent monomers as exemplified by pentaerythritol triacylate, pentaerythritol trimethacrylate, pentaerythritol tri(hydroxystyrene), cyanuric acid triacrylate, cyarnuric acid trimethacrylate, 1,1,1-trimethylolpropane triacylate, 1,1,1-trimethylolpropane trimethyacrylate, 1,1,1-trimethylolpropane tri(ethyl acrylate), and cyanuric acid tri(ethyl vinyl ether); tetravalent monomers as exemplified by tetra(acryloxymethyl)methane, and tetra(methacryloxymethyl)methane; hexavalent monomers as exemplified by dipentaerythritol hexaacrylate, dipentaerithritol hexamethacrylate; and also a polymerizable polymer precursor comprising a reactive vinyl group remaining at the terminal of an oligomer or polymer, or a polymerizable polymer precursor comprising a reactive vinyl group remaining at the side chain of an oligomer or polymer.

In the instance where the polymerizable polymer precursor is used in a capsular state, a method in which the compound is encapsulated by heating and melting and a method in which it is encapsulated by dissolving it in a solvent may be employed. Provided that, when the latter case is employed, it is necessary to use a method in which no solvent may remain in the capsule, and, for example, the method disclosed in Japanese Unexamined Patent Publication No. 63-80838, is preferred. Capsule films that can be used include known films of gelatin, polyurethane, polyurea, urea-formalin, melamine-formalin, etc.

As specific encapsulation methods, the encapsulation methods hitherto used in no carbon paper can be utilized, and they include, for example, the methods described in U.S. Pat. Nos. 2,730,456 and 2,800,457, Japanese Patent Publication Nos. 36-9168, 37-12379, 37-7730 and No. 43-23909.

In the instances where not the capsule method but the etching, peeling-apart, and inking and toning are carried out, it is required that the photosensitive silver salt, reducing agent, polymerization initiator and polymerizable polymer precursor to be contained in the same layer.

The layer structure may be constituted of a single layer or multi-layer structure, and, in the case of the multi-layer structure, the type and component ratio of compositions may differ for each layer.

The photosensitive silver salt contained in the photosensitive composition of the present invention refers to photosensitive silver halide, or organic salts containing silver halides. The photosensitive silver halides principally play role of producing silver metal serving as a catalyst by exposure to light, and the organic salt principally play a role of converting the reducing salt into an oxidized product by reaction with the reducing agent.

The photosensitive silver halide may include silver chloride, silver bromide, silver chlorobromide, silver iodobromide and silver chloroiodobromide, and these may be subjected to chemical sensitization or optical sensitization as conventionally done with respect to ordinary photographic emulsions. More specifically, usable as the chemical sensitization are sulfur sensitization, noble metal sensitization and reduction sensitization, and utilizable as the optical sensitization are methods in which conventionally well known sensitizing dyes are used.

The organic silver salt includes silver salts of aliphatic carboxylic acids, of aromatic carboxylic acids, of thiocarbonyl compounds having a mercapto group of α-hydrogen, and of imino group-containing compounds.

The aliphatic carboxylic acids include acetic acid, butyric acid, succinic acid, sebacic acid, adipic acid, oleic acid, linolic acid, linolenic acid, tartaric acid, palmitic acid, stearic acid, behenic acid and camphor acid, but, in general, silver salts having a smaller number of carbon atoms are proportionally less stable, and hence those having an appropriate number of carbon atoms are preferred. The aromatic carboxylic acids include benzoic acid derivatives, quinolinic acid derivatives, naphthalene carboxylic acid derivatives, salicyclic acid derivatives, gallic acid, tannic acid, phthalic acid, phenyl acetic acid derivatives, and pyromellitic acid.

The compounds having a mercapto or thiocarbonyl group include 3-mercapto-4-phenyl-1,2,4-triazole, 2-mercaptobenzoimidazole, 2-mercapto-5-amino-thiadiazole, 2-mercaptobenzotghiazole, s-alkylthio-glycolic acid (alkyl group carbon atom number of 12 to 22), dithiocarboxylic acids such as dithioacetic acid, thiamides such as thiostearoamide, and mercapto compounds such as 5-carboxy-1-methyl-2-phenyl-4-thiopyridine, mercaptotriazine, 2-mercaptobenzoxazole, mercaptooxazole, and 3-amino-5-benzylthio-1,2,4-triazole, which are described in U.S. Pat. No. 4,123,274.

The compounds having an imino group typically include benzotriazole or derivatives thereof, as described in Japanese Patent Publication Nos. 44-30270 or 45-18416, as exemplified by benzotriazole and alkyl-substituted benzotriazoles such as methylbenzotriazole, halogen-substituted benzotriazoles such as 5-chlorobenzotriazole, carboimidobenzotriazoles such as butylcarboimidobenzotriazole, nitrobenzotriazoles, as described in Japanese Unexamined Patent Publication No. 58-118639, sulfobenzotriazole, careboxybenzotriazole or salts thereof, or hydroxybenzotriazole, as described in Japanese Unexamined Patent Publication No. 58-118639, 1,2,4-triazole, as described in U.S. Pat. No. 4,220,709, or 1H-tetrazole, carbazole, saccharin, imidazole, and derivatives thereof. Of these, preferred organic salts include organic salts of aliphatic carboxylic acids.

The reducing agent contained in the photosensitive composition of the present invention is changed into an oxidized product by action of the silver metal as a catalyst, and include the compounds represented by the following Formulas (I), (II) and (III)

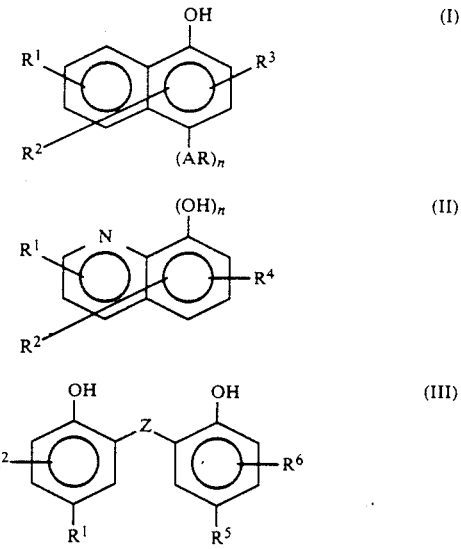

In the above Formulas (I), (II) and (III), $R^1$, $R^2$, $R^3$, $R^5$ and $R^6$ each independently represent a hydrogen atom, a halogen atom, a hydroxyl group, a substituted or unsubstituted alkyl group, a substituted or unsubstituted aralkyl group, a substituted or unsubstituted aryl group, an alkoxyl group, or a substituted or unsubstituted cycloalkyl group; $R^4$ represents a hydrogen atom, a halogen atom, a substituted or unsubstituted alkyl group, a substituted or unsubstituted aralkyl group, a substituted or unsubstituted aryl group, a substituted or unsubstituted cycloalkyl group, a carboxyl group, or a carboxylic acid ester group; A represents an oxygen atom, or a sulfur atom; R represents a hydrogen atom, an unsubstituted alkyl group, or a substituted or unsubstituted aralkyl group; n represents 0 or 1; and Z is a divalent linking group and represents an alkylidene group, an aralkylidene group, or a sulfur atom.

Specific examples of the compound represented by Formula (I) includes, for example, 1,4-dihydroxynaphthalene, 4-methoxy-1-naphthol, 4-ethoxy-1-naphthol, 5-methyl-4-methoxy-1-naphthol, 1,5-dihydroxynaphthalene, 4-chloro-1-naphthol, 5-chloro-1-naphthol, 4-methylthio-1-naphthol, 4-ethylthio-1-naphthol, 6-phenyl-4-methyl-1-naphthol, 6-phenyl-4-methoxy-1-naphthol, 6-benzyl-1-naphthol, 6-benzyl-4-methoxy-1-naphthol, 4-methyl-1,7-dihydroxynaphthalene, 4-methoxy-6-benzyl-1-naphthol, 4-methoxy-6-cyclohexyl-1-naphthol, 4-methylthio-6-cyclohexyl-1-naphthol, 3,4-dimethyl-1-naphthol, and 4-benzyloxy-1-naphthol.

Specific examples of the compound represented by Formula (II) includes, for example, 8-hydroxyquinoline, 4,8-dihydroxyquinoline-2-carboxylic acid, 4-hydroxyquinoline-2-carboxylic acid, 4-methyl-8-hydroxyquinoline, 4-benzyl-8-hydroxyquinoline, and 4,8-dihydroxy-5-methylquinoline.

Specific examples of the compound represented by Formula (III) includes, for example, 2,2'-methylenebis(6-t-butyl-1,4-dihydroxybenzene), 2,2'-methylenebis(4-methoxyphenol), 2,2'-methylenebis(4,6-di-t-butylphenol), 2,2'-methylenebis(4-methyl-6-t-butylphenol), 2,2'-butylidenebis(4-methoxyphenol), 2,2'-butylidenebis(6-t-butyl-1,4-dihydroxybenzene), 2,2'-thiobis(4-methoxyphenol), 2,2'-thiobis(6-methyl-1,4-dihydroxybenzene), 2,2'-thiobis(4,6-di-t-butylphenol), bis(2-hydroxy-5-methylphenyl) phenylmethane, and (3-t-butyl-5-methyl-2-hydroxyphenyl)-(5-methoxy-2-hydroxyphenyl)methane.

Of the above reducing agents, two or more kinds may be used in combination, and it is also possible to use these compounds in combination with any conventionally known reducing agents so long as the object of the present invention may not be hindered.

The photopolymerization initiator may include carbonyl compounds, sulfur compounds, halogen compounds, and photopolymerization initiators of redox type.

Specifically, the carbonyl compounds include diketones as exemplified by benzyl, 4,4'-dimethoxybenzyl, diacetyl, and camphorquinone; benzophenones as exemplified by 4,4'-bis(dimethylamino)benzophenone, and 4,4'-dimethylbenzophenone; acetophenones as exemplified by acetophenone, 4'-methoxyacetophenone; benzoin alkyl ethers; thioxanthones as exemplified by 2-chlorothioxanthone, 2,5-diethylthioxanthone, and thioxanthone-3-carboxylic acid-β-methoxy ethyl ester; chalcones and styrylketones having a dialkylamino group; and cumarins as exemplified by 3,3'-carbonyl-bis(7-methoxycumarin), and 3,3'-carbonylbis(7-diethylaminocumarin).

The sulfur compounds include disulfides as exemplified by dibenzothiazolyl sulfide, and decylphenyl sulfide.

The halogen compounds include, for example, carbon tetrabromide, quinolinesulfonyl chloride, and S-triazines having a trihalomethyl group.

The photopolymerization initiators of redox type include those used in combination of a trivalent iron ionic compound (as exemplified by ferric ammonium citrate) with a peroxide, and those used in combination of a photoreducing dye such as riboflavin or Methylene Blue with a reducing agent such as triethanolamine or ascorbic acid.

In the photopolymerization initiator described above, two or more compounds can also be used in combination to obtain a more efficient photopolymerization reaction.

Such combination of the photopolymerization initiators includes a combination of chalcones and styrylketones having a dialkylamino group or cumarins, with S-triazines having a trihalomethyl group or camphorquinone.

Besides the above, diazo compounds or peroxides having a photopolymerization initiating power can also be utilized as the photopolymerization initiator. These polymerization initiators may also be used in combination of two or more kinds thereof, or in combination with the above compounds.

As the thermopolymerization initiator, known initiators can be used, which are in general roughly grouped into an azo initiator and a peroxide initiator.

First, the azo initiator refers to an organic compound having at least one nitrogen-nitrogen double bond in its molecule, and may include, for example, azobisisobutyronitrile, azobiscyclohexanecarbonitrile, azobismethylphenethylcarbonitrile, azobis-sec-amylonitrile, azobisphenylethane, azobiscyclohexylpropylonitrile, azobismethylchloroethane, tritylazobenzene, phenylazoisobutyronitrile, and 9-(p-nitrophenylazo)-9-phenylfluorenone.

The peroxide initiator includes almost all the compounds so long as they are organic compounds having at least one oxygen-oxygen bond in the molecule. For example, it may include methyl ethyl ketone peroxide, cyclohexanone peroxide, 3,3,5-trimethylcyclohexanone peroxide, methylcyclohexanone peroxide, acetylacetone peroxide, 1,1-bis(t-butylperoxy)-3,3,5-trimethylcyclohexane, 1,1-bis(t-butylperoxy)cyclohexane, n-butyl-4,4-bis(t-butylperoxy)valerate, 2,2-bis(t-butylperoxy)butane, t-butyl hydroperoxide, cumene hydroperoxide, diisopropylbenzene hydroperoxide, p-menthane hydroperoxide, 2,5-dimethylhexane-2-dihydroperoxide, 1,1,3,3-tetramethylbutyl hydroxperoxide, di-t-butyl peroxide, t-butylcumyl peroxide, dicumyl peroxide, α,α'-bis(t-butylperoxyisopropyl)benzene, 2,5-dimethyl-2,5-di(t-butylperoxy)hexane, 2,5-dimethyl-2,5-di(t-butylperoxy)hexnye-3-acetyl peroxide, isobutyl peroxide, octanoyl peroxide, decanoyl peroxide, lauroyl peroxide, 3,5,5-trimethylhexanoyl peroxide, succinic acid peroxide, benzoyl peroxide, 2,4-dichldorobenzoyl peroxide, m-toluoyl peroxide, diisopropyl peroxydicarbonate, di-2-ethylhexyl peroxydicarbonate, di-n-propyl peroxydicarbonate, di-2-ethoxyethyl peroxydicarbonate, dimethoxyisopropyl peroxydicarbonate, di(3-methyl-3-methoxybutyl)peroxydicarbonate, t-butyl peroxyacetate, t-butyl peroxyisobutyrate, t-butyl peroxypivarate, t-butyl peroxyneodecanoate, t-butyl peroxyoctanoate, t-butyl peroxy-3,5,5-trimethylhexanoate, t-butyl peroxylaurate, t-butyl peroxybenzoate, di-t-diperoxyisophthalate, 2,5-dimethyl-2,5-di(benzoylperoxy)hexane, t-butyl maleic acid peroxide, and t-peroxyisopropylcarbonate. Other known thermopolymerization initiators can also be used.

The photosensitive material of the present invention is illustrated in FIGS. 5A to 5D. The photosensitive material of the present invention can be obtained by dissolving the above essential components in a solvent together with additives (such as polymerization initiators) and binders appropriately used, and coating the resulting solution on a support made of metal, plastic or paper, followed by drying.

Figure 5A:
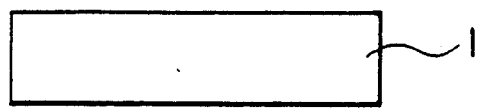
FIGS. 5A to 5D are diagramatical cross sections of the photosensitive material of the present invention.
Figure 5B:
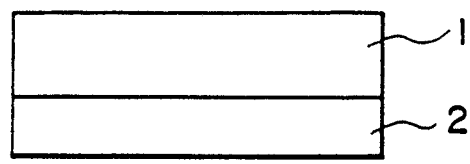
Figure 5C:
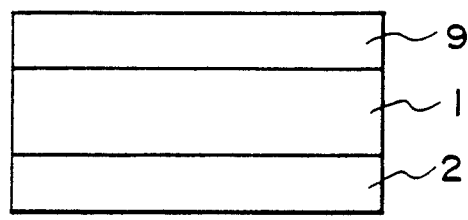
Figure 5D:
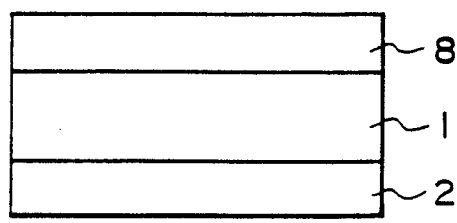

As illustrated in FIG. 5A, a support may not be required if the photosensitive layer 1 itself can serve as a support, but, as illustrated in FIG. 5B, usually the photosensitive layer 1 is laminated on the support 2. Further, as illustrated in FIG. 5C, an oxygen inhibitory layer 9 of PVA and the like may be provided on the photosensitive layer 1 so that the photosensitive layer can be prevented from being affected by oxygen upon carrying out the polymerization described later, or, as illustrated in FIG. 5D, an image receiving medium 8 as exemplified by art paper, coated paper, films and metal foil may be provided on the photosensitive layer 1.

Figure 5E:
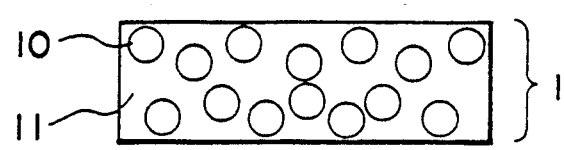
FIG. 5E is a diagramatical cross section to illustrate an embodiment of a photosensitive layer 1 in the photosensitive material of the present invention.

Alternatively, the above essential components may be formed into microcapsules together with the additives as used if desired (such as the polymerization initiator) to form the photosensitive layer 1 comprising the microcapsules 10 and a binder 11 (FIG. 5E).

The photosensitive material may be of nay form including flat sheets, cylinders, rolls and so forth, without any particular limitations.

Suitable binders used in the present invention can be selected from a wide range of resins.

They specifically include cellulose esters as exemplified by nitrocellulose, cellulose phosphate, cellulose sulfate, cellulose acetate, cellulose propionate, cellulose butyrate, cellulose myrystate, cellulose palmitate, cellulose acetate propionate, and cellulose acetate butyrate; cellulose ethers as exemplified by methyl cellulose, ethyl cellulose, propyl cellulose, and butyl cellulose; vinyl resins as exemplified by polystyrene, polyvinyl chloride, polyvinyl acetate, polyvinyl butyral, polyvinyl acetal, polyvinyl alcohol, and polyvinyl pyrrolidone; copolymer resins as exemplified by a styrene/butadiene copolymer, a styrene/acrylonitrile copolymer, a styrene/butadiene/acrylonitrile copolymer, and a vinyl chloride/vinyl acetate copolymer; acrylic resins as exemplified by polymethyl methacrylate, polymethyl acrylate, polybutyl acrylate, polyacrylic acid, polymethacrylic acid, polyacrylamide, and polyacrylonitrile; polyesters as exemplified by polyethylene terephthalate; polyarylate resins as exemplified by poly(4,4'-isopropylidene,diphenylene-co-1,4-cyclohexylenedimethylene carbonate), poly(ethylenedioxy-3,3'-phenylene thiocarbonate), poly(4,4'-isopropylidene,-diphenylene carbonate-coterephthalate), poly(4,4'-isopropylidenediphenylene carbonate), poly(4,4'-sec-butylidenediphenylene carbonate), and poly(4,4'-isopropylidenediphenylene carbonate-block-oxyethylene); polyamides; polyimides; epoxy resins; phenol resins; and polyolefins as exemplified by polyethylene, polypropylene, and chlorinated polyethylene.

Besides these, it is also possible to optionally add to the photosensitive layer a coloring material, an antifoggant, a photo-discoloration preventive agent, a solid solvent, a surface active agent, an antistatic agent, etc.

In the photosensitive material, the components described above in detail may preferably be used in the proportion as follows:

The silver halide may be contained in an amount of preferably from 0.001 mol to 2 mols, and more preferably from 0.05 to 0.4 mol, per mol of the organic silver salt. The reducing agent may be contained in an amount of preferably from 0.2 mol to 3 mols, and more preferably from 0.4 mol to 1.3 mol, per mol of the organic silver salt. The polymerization initiator may be contained in an amount of preferably from 0.1 part by weight to 50 parts by weight, and more preferably from 0.5 part by weight to 30 parts by weight, based on 100 parts by weight of the polymerizable polymer precursor. The polymerization initiator may be contained in an amount of preferably from 0.01 mol to 10 mols, and more preferably from 1 mol to 3 mols, per mol of the reducing agent.

The photosensitive layer may have a film thickness of from 0.1 μm to 2 mm, and preferably from 1 μm to 0.1 mm, in approximation.

Preferred mixing proportion of the above components in the photosensitive layer may vary depending on the polymer image forming methods to be employed, but employment of the polymerizable polymer precursor having a melting point of 35° C. or more does not bring about any difference in the mixing ratio from the corresponding techniques provided prior to the present invention.

The image forming method of the present invention will be described below.

The image forming method of the present invention includes a method (A), comprising the steps of imagewise exposure and heating, thereby forming a polymer image at an imagewise unexposed area, a method (B), comprising carrying out imagewise exposure and heating, followed by whole areal exposure to form a polymer image at the imagewise unexposed area, and a method (C), comprising laminating the thus formed polymer image and an image receiving medium, and carrying out heating and pressing to transfer the imagewise unexposed area to the image receiving medium.

Figure 1B:
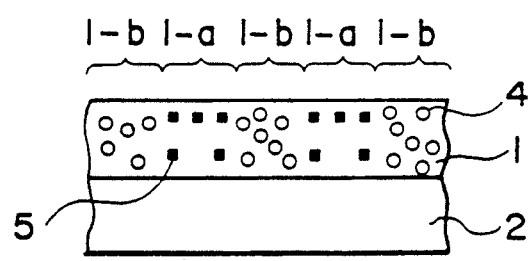
Figure 1C:
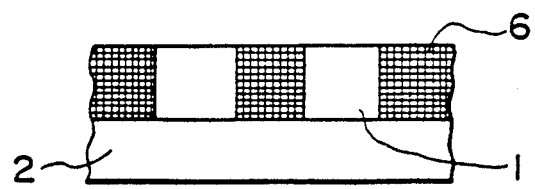

To exemplify the image forming method (A), it comprises the steps of:

(a) subjecting the photosensitive material to imagewise exposure to form a latent image, as in FIG. 1A;

(b) heating the photosensitive material on which the latent image has been formed, to convert said latent image into a latent image comprised of the above-described reducing agent and the oxidized product produced from said reducing agent by said heating, as in FIG. 1B; and (c) allowing thermopolymerization to occur by utilizing the first-mentioned heating or by heating under new conditions to form a polymer image at the imagewise unexposed area produced in the step (a), as in FIG. 1C.

In this instance, the photosensitive material is required to contain the thermopolymerization initiator.

Figure 2A:
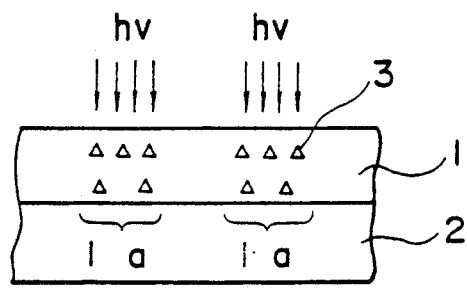
Figure 2B:
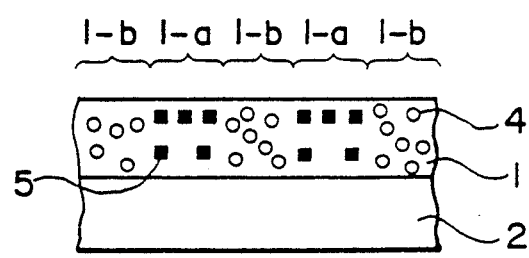
Figure 2C:
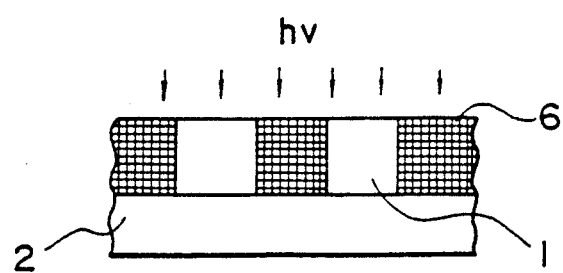

To exemplify the image forming method (B), it comprises the steps of:

(a) subjecting the photosensitive material to imagewise exposure to form a latent image, as in FIG. 2A;

(b) heating the photosensitive material (1) on which the latent image has been formed to convert said latent image into a latent image comprised of the above-described reducing agent and the oxidized product produced from said reducing agent by said heating, as in FIG. 2B; and (c) subjecting the photosensitive material having the latent image comprised of said reducing agent and oxidized product, to whole areal exposure to polymerize the above-described polymerizable polymer precursor, corresponding to the distribution of said reducing agent and oxidized product, thereby forming a polymer image, as in FIG. 2C.

In this instance, the photosensitive material is required to contain the photopolymerization initiator.

How each step in the method (A) or (B) proceeds will be further described below with reference to FIGS. 1A, 1B, 1C, and FIGS. 2A, 2B, and 2C.

Step (a) in the image forming method (A) or (B) of the present invention (FIGS. 1A and 2A) is the step of carrying out the writing of an image by light, where a photosensitive layer 1 on a support 2 is exposed to light for a desired image according to analog exposure using a mask or the like, or digital exposure using a laser or the like to apply image signals such as external signals or photosignals, thereby exposing a desired image to light.

As a result, silver metals 3 are formed on the photosensitive silver halide in an exposed area 1a, which form the latent image. The silver metals 3 thus formed act as a catalyst for the thermal reaction between the organic silver salt and reducing agent contained in the photosensitive layer 1.

The exposure at the stage of the writing of the latent image may be carried out by appropriately selecting conditions under which any desired performances such as a sufficient contrast can be obtained in the resulting polymer image, depending on the concentration, type, etc. of the silver halide contained in the photosensitive layer.

Since in this step the photosensitive silver halide is used, it becomes possible to effect the writing with a high sensitivity.

Next, in step (b) in the method (A) or (B) of the present invention (FIGS. 1B and 2B), the photosensitive material 1 on which the latent image has been formed is heated, so that the silver metals 3 selectively act as a catalyst in the exposed area 1a to cause the reaction between the organic silver salt and reducing agent, where the organic silver salt is reduced to a silver atom and at the same time the reducing agent is oxidized to form an oxidized product 5.

As a result, there are formed the exposed area 1a containing the oxidized product 5 and an unexposed area 1b containing the reducing agent 4. Since, the reducing agent 4 used in the photosensitive material 1 is oxidized to become an oxidized product having a polymerization inhibitory power against the polymerizable polymer precursor, a latent image which is ascribable to a difference in the polymerization inhibitory power, constituted by the distribution of the oxidized products 5, is formed on the photosensitive layer 1.

In the method (A), the thermopolymerization takes place at the same time when or after the latent image has been formed, thus forming a polymerized area 6 at the imagewise unexposed area, as in FIG. 1C.

The heating in this step (b) is carried out by appropriately selecting conditions necessary for the oxidation-reduction reaction to proceed. Though not broadly suitable since the heating depends on the composition, etc. of the photosensitive layer, the heating may preferably be carried out at 60° C. to 180° C., and more preferably 100° C. to 150° C., for 1 second to 5 minutes, and more preferably 3 seconds to 60 seconds. In general, the heating at high temperature is completed in a short time, and the heating at low temperatures takes a long time to complete heating. A heating means includes a method in which a hot plate, heat roll, thermal head or the like is used, as well as a method in which a heating element of the support is electrified to carry out the heating, or a method in which the heating is carried out by irradiation with laser beams. Usually the heating is made under substantially uniform heating.

Subsequently, step (c) in the method (B) of the present invention follows, but, before starting step (c), a transferring medium or the like may be laminated on the surface to be exposed to light, for the purpose of preventing the polymerization reaction from being inhibited by oxygen.

In step (c), (FIG. 2C), the photosensitive layer 1 is subjected to whole areal exposure to allow the photopolymerization initiator contained in the layer to be decomposed, generating radical species. The radical species cause the polymerization reaction to form a polymerized area 6 in the photosensitive layer 1. Namely, since the concentration of the oxidized product having the polymerization inhibitory power differs between the exposed area 1a and unexposed area 1b, a difference in a polymerization state is produced between the exposed area 1a and unexposed area 1b, and this difference results in the formation of the polymer image.

In the image forming methods (A) and (B) of the present invention, the oxidized product 5 has the polymerization inhibitory power and the unexposed area becomes the polymerized area, so that the polymer image, which is positive, can be formed.

As light sources used in the above steps (a) and (c), usable are, for example, sunlight, tungsten lamps, mercury lamps, halogen lamps, xenon lamps, fluorescent lamps, LEDS, and lasers, and the wavelength of the light used in these steps may be the same or different. Even if the light having the same wavelength is used, the latent image can be sufficiently written with use of light having an intensity of the level that may not cause photopolymerization in the above step (a), since the silver halide usually has a sufficiently higher photosensitivity than the photopolymerization initiator.

In the above step (c) the photosensitive material may be additionally heated for the purpose of accelerating photopolymerization, or remaining heat in the above step (b) may be utilized.

In the method (C), the polymer image thus obtained in the method (A) or (B) is laminated on the image receiving medium, followed by heating and pressing to transfer the unpolymerized area to the image receiving medium.

Figure 3:
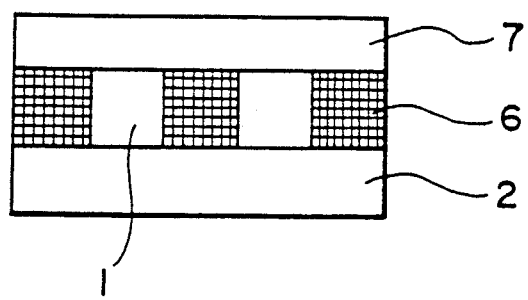
FIGS. 3 and 4 are diagramatical cross sections to illustrate the respective steps of making an image visible, in the method of the present invention.
Figure 4:
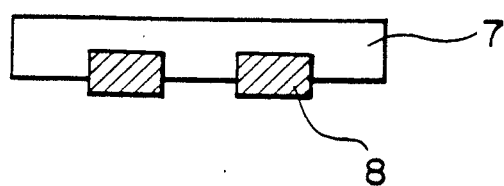

The method (C) will be described with reference to FIGS. 3 and 4. FIG. 3 illustrates a state in which the polymer image has been laminated, where the unpolymerized area 1 is transferred to the image receiving medium by heating and pressing, thus forming an image 8, as in FIG. 4, on the image receiving medium. When this transfer is effected, the present invention, which employs the polymerizable polymer precursor having a melting point of 35° C. or more, can achieve an image which is free of image unclearness, has a good correspondence between the unpolymerized area 1 and the image area 8, and has a high resolution. The heating and pressing are required to be carried out under conditions such that the polymerizable polymer precursor may give tackiness. Thus the heating may preferably be carried out a temperature of from 60° C. to 180° C., and the pressing, preferably at a pressure of from 20 to 300 kg/m².

EXAMPLES

The present invention will be described below by giving Examples, but the present invention is by no means limited to these. In the following, "part(s)" is/are by weight.

EXAMPLE 1

Preparation of microcapsules

In a mixed solvent of 45 parts of chloroform with 40 parts of methyl ethyl ketone, 30 parts of a polymerizable polymer precursor (m.p. 75°-77° C.) having the structure shown below, 3.1 parts of a leuco dye, TG-11 (trade name, available from Nippon kayaku Co., Ltd.) were dissolved. Subsequently, 0.8 part of behenic acid was added, followed by addition of 1.0 part of silver behanate, and these were dispersed with a homogenizer (5,000 rpm) for about 10 minutes.

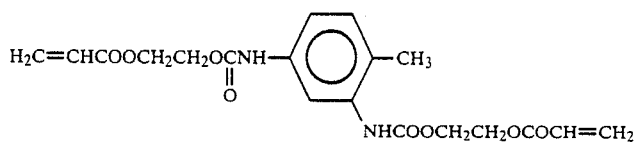

Subsequently 0.2 part of AgBr, 0.35 part of 4-methoxynaphthol, 0.1 part of phthalazinone, 1.3 parts of 2-chlorothioxanthone and 0.6 part of ethyl p-dimethylaminobenzoate were added, and the mixture was further stirred for 30 minutes.

The dispersion thus prepared was encapsulated by the following procedures: 2.0% by weight of Isoban (trade name, available from Kuraray Co., Ltd.) which is an isobutyrene-maleic anhydride copolymer, and 0.3% by weight of pectin were dissolved, which were added in 150 parts of an aqueous solution adjusted to pH 4.5 with sulfuric acid, and the mixture was emulsified using a homogenizer at 7,000 rpm. While passing air therethrough, the emulsion was stirred for about 3 hours, followed by addition of 2 parts of melamine, 5.5 parts of an aqueous 50 wt % urea solution and 12 parts of an aqueous 37% formalin solution to carry out reaction at 65° C. for 3 hours. Thereafter, the pH was adjusted to 9.0 using 20% NaOH water, and 0.6 part of sodium bisulfate and 1.1 parts of sodium sulfite were added, and the reaction mixture was left to cool. The resulting capsules had an average particle size of 8.6 μm.

PREPARATION OF PHOTOSENSITIVE SHEET HAVING IMAGE FORMING LAYER

To the above capsule dispersion, 40 parts of an aqueous 5.0% by weight polyvinyl alcohol solution was added, and the solution was uniformly coated on art paper of 45 g/m² so as to give a coating weight of 6 g/m².

PREPARATION OF IMAGE RECEIVING MEDIUM

In 125 g of water, 11 g of an aqueous 40% sodium hexametaphosphate solution, and 30 g of a zinc salt of salicylic acid derivative (R-054; trade name, available from Sanko Kagaku K.K.), 60 g of 55% calcium carbonate slurry and 20 g of active clay were further mixed, and the mixture was milled with a ball mill. To 100 g of the solution obtained, 3 g of 50% SBR latex and 20 g of 3% polyvinyl alcohol were added. The resulting solution was uniformly coated on art paper of 45 g/m² so as to give a coating weight of 10 g/m². Thereafter, calendaring was applied to obtain an image receiving medium.

IMAGE FORMATION

A mask comprising a line image of 20 μm, 30 μm and 40 μm in distance and width was brought into close contact with the above photosensitive sheet, and light from a fluorescent lamp of 360 nm with an electric power of 20 W was irradiated thereon for 1 second. This was passed through a heat developing machine regulated to a temperature of 120° C., and the light was further irradiated on the whole area for 30 seconds. This and the image receiving medium were put together, and allowed to pass through a 80° C. heat roll applied with a pressure of 85 kg/cm². As a result, a black line image corresponding to the imagewise exposed area was produced on the image receiving medium side.

EXAMPLE 2

Example 1 was repeated to form an image, except that the polymerizable polymer precursor was replaced with 20 parts of a structure shown below, having a melting point of 51° to 55° C., and 5 parts of dipentaerythritol hexaacrylate.

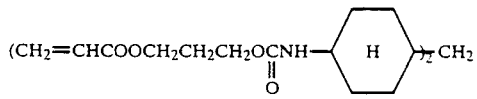

COMPARATIVE EXAMPLE 1

Example 1 was repeated to obtain a photosensitive sheet, except that the polymerizable polymer precursor was replaced with liquid trimethylolpropane triacrylate. After the imagewise exposure, heat development and photopolymerization, the sheet and the image receiving medium were put together, and allowed to pass through a roller applied with a pressure of 250 kg/cm² to obtain an image.

EXAMPLE 3

Example 1 was repeated except that the polymerizable polymer precursor was replaced with 20 parts of 1,6-bis[2-(acryloxy)acetoxy]hexane (m.p. 63°-65° C.) and 5 parts of trimethylolpropane triacrylate. The above polymerizable polymer precursor mixture in a waxy state was melted at 40° C. to turn into a transparent state.

EXAMPLE 4

Example 1 was repeated except that the polymerizable polymer precursor was replaced with 15 parts of bis{[2-(acryloxy)ethoxycarbamoyl]cyclohexyl}methane (m.p. 125°-129° C.) and 5 parts of trimethylolpropane triacrylate. The above polymerizable polymer precursor mixture in a waxy state was melted at 36° C. to turn into a transparent liquid state.

COMPARATIVE EXAMPLE 2

Example 1 was repeated except that the polymerizable polymer precursor was replaced with 1.2 parts of 1,6-bis[2-(acryloxyacetoxy]hexane and 30 parts of trimethylolpropane triacrylate. The above polymerizable polymer precursor mixture was liquid at room temperature (25° C.).

EVALUATION

As compared with Examples 1, 2, 3 and 4, Comparative Examples 1 and 2 produced a strong unpleasant odor when the transfer processing was carried out, and caused practical problems.

Resolution of the image obtained in each Examples 1 to 4 and Comparative Examples 1 and 2 was measured by use of a microscope. Results obtained are shown in Table 1.

|  | Resolvable minimum line width |
| --- | --- |
| Example 1 | 20 μm |
| Example 2 | 25 μm |
| Example 3 | 25 μm |
| Example 4 | 25 μm |
| Comparative Example 1 | 40 μm |
| Comparative Example 2 | 40 μm |

COMPARATIVE EXAMPLE 3

Example 1 was repeated to obtain a photosensitive sheet, except that the polymerizable polymer precursor was replaced with NK-Ester 23G (trade name, available from Shin-Nakamura Chemical Co., Ltd.; m.p. 30° C.). After the imagewise exposure, heat development and photopolymerization, the sheet and the image receiving medium were put together, and allowed to pass through a roller applied with a pressure of 250 kg/cm² to obtain an image.

On this occasion, the image density was as low as 0.9 although it was 1.4 in Comparative Example 1. Carrying out the transfer by heating and pressing under the same conditions as in Example 1 resulted in increase of the image density to 1.4, but the resolvable minimum line width was enlarged from 20 μm to 40 μm.

EXAMPLE 5

In 10 parts of isopropanol, 0.8 part of polyvinyl butyral was dissolved, and 0.1 part of AgBr and 0.6 part of silver behenate were further dispersed in this solution. Subsequently, in the resulting dispersion, 0.29 part of 4-methoxy-1-naphthol was dissolved to obtain Solution A.

Separately from the above, 0.15 part of 2-chlorothioxanthone, 0.18 part of ethyl p-dimethylaminobenzoate, 0.6 part of polymethyl methacrylate and 2.5 parts of 1,6-bis[2-(acryloxy)acetoxy]hexane (m.p. 63°-65° C.) were dissolved in 15 parts of methyl ethyl ketone to obtain Solution B.

Next, Solution B was thoroughly mixed with Solution A, and the resulting mixed solution was coated on a polyethylene terephthalate (PET) of 12 μm thick so as to give a dried film thickness of 2 μm to provide a photosensitive layer, and a polyvinyl alcohol (PVA) layer of 2 μm thick was further provided thereon, thus obtaining a photosensitive material.

Next, a mask film was superposed on the photosensitive material, which was imagewise exposed to light to form a latent image. This imagewise exposure was carried out for 10 msec. on the photosensitive material with a distance of 5 cm from a light source, using as the light source a fluorescent lamp having a fluorescent peak at 420 nm and a luminous output of 5 mW.

Thereafter the mask was removed, and the photosensitive material was allowed to pass in 20 seconds through a heat developing machine regulated to 105° C. Further, the photosensitive material was put on a hot plate heated to 60° C., and light from a fluorescent lamp having a fluorescent peak at 390 nm and a luminous output of 10 mW was irradiated thereon for 10 seconds with a distance of 5 cm.

As a final step, the PVA layer was removed by washing with water, and thereafter the photosensitive material was rinsed in ethanol. As a result, the imagewise exposed area was removed from the PET film, and a sharp positive image comprised of the polymerized area remained on the PET film.

The processing in the present Example was carried out entirely under safety light.

COMPARATIVE EXAMPLE 4

Example 4 was repeated to obtain a photosensitive material, except that 2.5 parts of 1,6-bi[2-(acryloxy)acetoxy]hexane in Example 5 was replaced with 2.5 parts of trimethylolpropane triacrylate.

After this photosensitive material was imagewise exposed to light, it was allowed to pass through a heat developing machine regulated to 105° C., followed by whole areal exposure to form a polymer image, to find, however, that the image had no sharpness after etching processing.

The photosensitive materials prepared in Example 5 and Comparative Example 4 were subjected to storage resistance tests for 2,000 hours under safetylight and under conditions of 35° C. and 70% RH, show that fogging was produced on the photosensitive material of Comparative Example 4, but no fogging was produced on the photosensitive material of Example 5.

EXAMPLE 6

AgBr: 0.1 part
Silver behenate: 0.7 part
Isopropyl alcohol/toluene (1/1): 15.0 parts
4-Benzyloxy-1-naphthol: 0.4 parts
Polymethyl methacrylate: 3.0 parts
1,12-Bis[2-(acryloxy)acetoxy]dodecane (m.p. 70°-72° C.): 1.5 parts
7-Methoxy-3-benzoylcumarin: 0.16 part
Ethyl-4-dimethylaminobenzoate: 0.04 part A solution with the above formulation was thoroughly mixed by dispersion with a dispersion mixer to prepare an emulsion. Next, the emulsion was coated on a polyester film of 50 μm thick using a bar coater, followed by drying to form a photosensitive layer of 5 μm thick, and thereafter a polyester film of 12 μm thick was laminated thereon. Subsequently, the photosensitive layer was imagewise exposed to light of about 400 nm or more for 5 seconds through a cut filter (Y-42, tradename, available from Toshiba Glass Co., Ltd.), using an ultrahigh-pressure mercury lamp (VSH-500D, tradename, manufactured by Ushio Inc.) as a light source. Next, the photosensitive layer was heated at 115° C. for 10 seconds to effect thermal amplification of the silver halide latent image. Subsequently the above filter was removed, followed by exposure to light for 20 seconds.

Thereafter, the polyester film was peeled off. Then, a plain paper and the photosensitive layer were superposed, heated to 80° C., and allowed to pass between rollers applied with a pressure of 25 kg/cm², followed by peeling. The photosensitive layer corresponding to the unexposed area was transferred on the plan paper, and little remained on the polyester film.

COMPARATIVE EXAMPLE 5

Example 6 was repeated to form a photosensitive material and to make evaluation, except that 1,12-bis[2-(acryloxy)acetoxy]dodecane in Example 6 was replaced with a liquid polymerizable polymer precursor. The photosensitive layer corresponding to the unexposed area was transferred on the plain paper, but partially remained on the polyester film, and yet with an inconstant remaining rate.

EXAMPLE 7

AgBr: 0.1 part
Silver behenate: 0.7 part
Isopropyl alcohol/toluene (1/1): 10.0 parts
Methyl methacrylate/butyl acrylate copolymer: 2.0 parts
4,8-Dihydroxyquinonline-2-carboxylic acid: 0.35 part
1,3-Bis[2-(acryloxyacetoxy)ethoxycarbamoyl]benzene: 1.8 parts
Dipentaerythritol heaxaacrylate: 0.2 part
7-Methoxy-3-benzoylcumarin: 0.16 part
Ethyl-4-dimethylaminobenzoate: 0.04 part A solution with the above formulation was thoroughly mixed by dispersion with a dispersion mixer to prepare an emulsion. Next, the emulsion was coated on a polyester film of 50 μm thick using an applicator, followed by drying to form a photosensitive layer of 5 μm thick. Thereafter a polyester film of 12 μm thick was laminated thereon. Subsequently, the photosensitive layer was imagewise exposed to light for 5 seconds, using a tungsten daylight lamp as a light source. Next, the photosensitive layer was heated at 120° C. for 20 seconds to effect thermal amplification of the silver halide latent image. Subsequently, using an ultraviolet fluorescent lamp, the whole areal exposure was carried out for 60 seconds. Thereafter, the polyester film on the photosensitive layer was peeled therefrom, and developing was carried out with carbon black by using a fur brush. As a result, the carbon black adhered on the exposed area (unpolymerized area) and no carbon adhered on the unexposed area (polymerized area), resulting in the formation of a black pattern with an excellent resolution.

As for the resolution of the black pattern, a pattern with a line width of 10 μm was resolvable, also with a good image sharpness.

COMPARATIVE EXAMPLE 6

Example 7 was repeated except that 1,3-bis[2-(acryloxyacetoxy)ethoxycarbamoyl]benzene was replaced with trimethylolpropane trimethacrylate.

The resulting image with a black pattern was not constant in the line width of 10 μm. The photosensitive materials prepared in Example 7 and Comparative Example 6 were also subjected to storage resistance tests for 2,000 hours under safetylight and under conditions of 35° C. and 70% RH, show that fogging was produced on the photosensitive material of Comparative Example 6, but only slight fogging was little produced on the photosensitive material of Example 7.

EXAMPLE 8

AgBr: 0.1 part
Silver behenate: 0.7 part
Isopropyl alcohol/toluene (1/1): 10.0 parts
Polyvinyl butyral: 2.0 parts
2,2'-Methylenebis(4-methoxyphenol): 0.4 part
1,4-Bis[2-(acryloxyacetoxy)ethoxycarbamoyl]cyclohexane (m.p. 104°–106° C.): 2.5 parts
Azobisisobutyronitrile: 0.5 part
Phthalazinone: 0.1 part A solution with the above formulation was thoroughly mixed by dispersion with a dispersion mixer to prepare an emulsion. Next, the emulsion was coated on a polyester film of 50 μm thick using an applicator, followed by drying to form a photosensitive layer of 5 μm thick. Thereafter a polyester film of 12 μm thick was laminated thereon. Subsequently, the photosensitive layer was imagewise exposed to light for 10 seconds, using a tungsten daylight lamp as a light source. Next, the photosensitive layer was heated for 40 seconds using a heat developing machine regulated to 80° C., and then heated for 10 seconds using a heat developing machine regulated to 110° C. Thereafter the polyester film of 12 μm thick was peeled and kept immersed in an ethanol bath, so that the imagewise exposed area was dissolved and a polymer image remained on the film.

As having described above in detail, the use of the photosensitive composition in which the polymerizable polymer precursor having a melting point of 35° C. or more is used enabled formation of an image without generation of unpleasant odor, complicated processing, and lack of image sharpness, according to various embodiments.

We claim:

1. An image-forming method using a photosensitive material, comprising a photosensitive and heat-developable element and a polymerizable element, wherein said photosensitive and heat developapable element comprises at least a photosensitive silver halide and an organic silver salt, wherein said material contains at least one compound selected from the compound represented by Formula (I), (II) or (III) shown below,

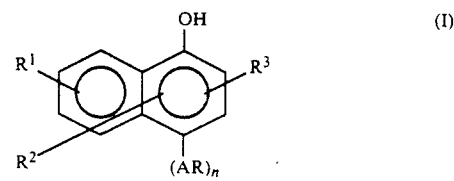

(I)

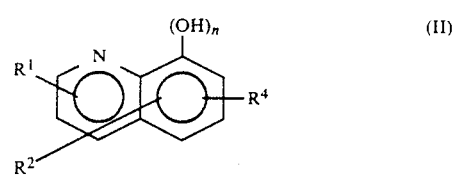

(II)

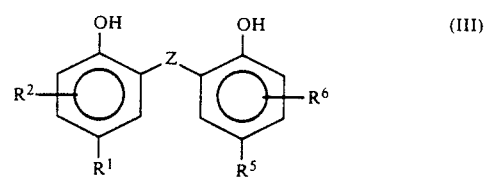

(III)

being adapted to form silver atoms when subjected to an imagewise exposure and heat development, a polymerizable polymer precursor having a melting point of 35° C. or more, said polymerizable polymer precursor being inhibited against polymerization in the presence of said silver atoms, a polymerization initiator contained in an amount of from 0.01 mol to 10 mol per mol of said compound, said polymerization initiator being a photopolymerization initiator; wherein $R^1$, $R^2$, $R^3$, $R^5$ and $R^6$ each independently represent a hydrogen atom, a halogen atom, a hydroxyl group, a substituted or unsubstituted alkyl group, a substituted or unsubstituted aralkyl group, a substituted or unsubstituted aryl group, an alkoxyl group, or a substituted or unsubstituted cycloalkyl group; $R^4$ represents a hydrogen atom, a halogen atom, a substituted or unsubstituted alkyl group, a substituted or unsubstituted aralkyl group, a substituted or unsubstituted aryl group, a substituted or unsubstituted cycloalkyl group, a carboxyl group, or a carboxylic acid ester group; A represents an oxygen atom, or a sulfur atom; R represents a hydrogen atom, an unsubstituted alkyl group, or a substituted or unsubstituted aralkyl group; n represent 0 or 1; and Z is a divalent linking group and represents an alkylidene group, an aralkylidene group, or a sulfur atom; and when said photosensitive material is exposed to light with a wavelength of 400 to 900 nm, heated to 60° to 180° C. and exposed to light with a wavelength of 250 to 700 nm, an area of said polymerizable layer, corresponding to an unexposed area of said photosensitive layer, is polymerized.

2. The image-forming method according to claim 1, wherein said photosensitive silver halide is contained in an amount of from 0.001 mol to 2 mols per mol of said organic silver salt.

3. The image-forming method according to claim 1, wherein at least one compound selected from said compound represented by Formula (I), (II) or (III) is contained in an amount of from 0.2 mol to 3 mols per mol of said organic silver salt.

4. The image-forming method according to claim 1, wherein said polymerization initiator is contained in an amount of from 0.1 part by weight to 50 parts by weight based on 100 parts by weight of said polymerizable polymer precursor having a melting point of 35° C. or more.

5. The image-forming method according to claim 1, wherein said polymerizable polymer precursor having a melting point of 35° C. or more has a melting point of 140° C. or less.

6. The image-forming method according to claim 1, wherein said photosensitive material has a thickness of from 0.1 μm to 2 mm.

7. The image-forming method according to claim 1, wherein said photosensitive material further comprises a support.

8. The image-forming method of claim 1 including the steps of (a) subjecting the photosensitive material to imagewise exposure of light with a wavelength of 400 to 900 nm to produce silver metal in said photosensitive material according to said imagewise exposure, (b) heating said photosensitive material to produce silver atoms according to imagewise exposure in said photosensitive material, and (c) subjecting said photosensitive material to whole area exposure with a wavelength of 250 to 700 nm to polymerize a part of said photosensitive material where said silver metal has not been produced.

9. The image-forming method according to claim 8, further comprising the step of separating an imagewise exposed area from an imagewise unexposed area of said photosensitive material, after said step of whole areal exposure.

10. The image-forming method according to claim 8, further comprising the step of applying a color developer to an imagewise exposed area or imagewise unexposed area of said photosensitive material, after said step of whole areal exposure.

11. The image-forming method of claim 1 including the steps of (a) subjecting to imagewise exposure the photosensitive material to produce silver metal according to said imagewise exposure in said photosensitive material, (b) heating said photosensitive material to produce silver atoms according to said imagewise exposure in said photosensitive material, (c) polymerizing a part of said photosensitive material where said silver metal has not been produced, and (d) transferring an imagewise exposed area of said photosensitive material to an image receiving medium.

12. The image-forming method according to claim 11, wherein said steps (b) and (c) are simultaneously carried out.

13. The image-forming method according to claim 11, wherein said step of transferring is the steps of laminating an image receiving medium on said photosensitive material, and, thereafter heating and pressing the resulting laminated body.

14. The image-forming method according to claim 13, wherein said heating comprises heating said laminated body at a temperature of from 60° to 150° C.

15. The image-forming method according to claim 13, wherein said pressing comprises pressing said laminated body at a pressure of from 20 to 300 kg/cm².

* * * * *

UNITED STATES PATENT AND TRADEMARK OFFICE
CERTIFICATE OF CORRECTION

PATENT NO. : 5,064,744

DATED : November 12, 1991

INVENTOR(S) : TETSURO FUKUI, ET AL.

Page 1 of 5

It is certified that error appears in the above-identified patent and that said Letters Patent is hereby corrected as shown below:

On the title page:

<u>IN [56] REFERENCES CITED</u>

Under U.S. PATENT DOCUMENTS, insert:

--3,874,947  4/1975  Hagakawa et al. ...... 96/51
      4,649,098  3/1987  Takida ............... 430/270--.

Under FOREIGN PATENT DOCUMENTS, insert:

--    202490  11/1986  European Pat. Off.
         232721   8/1987  European Pat. Off.
         326424   8/1989  European Pat. Off.
         328364   8/1989  European Pat. Off.
       3207064  12/1982  Fed. Rep. of Germany
    58-192032  11/1983  Japan
     61-75342   4/1986  Japan --.

COLUMN 1

Line 18, "particle," should read --particular,--.
  Line 34, "an" (second occurrence) should read --a--.

COLUMN 3

Line 43, "has ever" should read --has even--.
  Line 57, "material that form" should be deleted.
  Line 58, delete line 58.
  Line 59, "area, and a photosensitive" should be deleted.

COLUMN 6

Line 36, "stage," should read --state,--.

UNITED STATES PATENT AND TRADEMARK OFFICE
CERTIFICATE OF CORRECTION

PATENT NO. : 5,064,744
DATED : November 12, 1991
INVENTOR(S) : TETSURO FUKUI, ET AL.

It is certified that error appears in the above-identified patent and that said Letters Patent is hereby corrected as shown below:

COLUMN 7

Line 68, "acyryloxpropionic" should read
--acryloxypropionic--.

COLUMN 8

Line 59, "triacylate," should read --triacrylate,--.

COLUMN 9

Line 17, "no carbon paper" should read --carbonless paper--.
Line 36, "role" should read --a role--.
Line 37, "salt" should read --salts--.
Line 38, "reducing salt" should read --reducing agent--.
Line 50, "well known" should read --well-known--.
Line 54, "of" should read --or--.
Line 66, "salicyclic" should read --salicylic--.

COLUMN 10

Line 4, "2-mercaptobenzotghiazole" should read
--2-mercaptobenzothiazole--.
Line 21, "careboxybenzotriazole" should read
--carboxybenzotriazole--.

COLUMN 11

Line 7, "includes," should read --include,--.
Line 19, "includes," should read --include,--.
Line 25, "includes," should read --include,--.

UNITED STATES PATENT AND TRADEMARK OFFICE
CERTIFICATE OF CORRECTION

PATENT NO. : 5,064,744
DATED : November 12, 1991
INVENTOR(S) : TETSURO FUKUI, ET AL.

It is certified that error appears in the above-identified patent and that said Letters Patent is hereby corrected as shown below:

COLUMN 12

Line 46, "hexnye-" should read --hexyne- --.

COLUMN 13

Line 20, "nay" should read --any--.
    Line 29, "acetate propionate" should read --acetate·propionate-- and "acetate butyrate" should read --acetate·butyrate--.
    Line 47, "coterephthalate)," should read --co-terephthalate),--.

COLUMN 15

Line 12, "external signals" should read --external electric signals--.
    Line 16, "area 1a" should read --area 1-a--.
    Line 35, "area 1a" should read --area 1-a--.
    Line 40, "area 1a" should read --area 1-a--.
    Line 42, "area 1b" should read --area 1-b-- and "Since," should read --Since--.

COLUMN 16

Line 17, "area 1a" should read --area 1-a-- and "area 1b," should read --area 1-b,--.
    Line 19, "area 1a" should read --area 1-a-- and "area 1b," should read --area 1-b,--.

UNITED STATES PATENT AND TRADEMARK OFFICE
CERTIFICATE OF CORRECTION

PATENT NO. : 5,064,744
DATED : November 12, 1991
INVENTOR(S) : TETSURO FUKUI, ET AL.

It is certified that error appears in the above-identified patent and that said Letters Patent is hereby corrected as shown below:

COLUMN 16

Line 29, "LEDS," should read --LEDs,--.
    Line 37, "step (c)" should read --step (c),--.

COLUMN 17

Line 10, "kayaku" should read --Kayaku--.
    Line 13, "behanate," should read --behenate,--.
    Line 67, "calendaring" should read --calendering--.

COLUMN 19

Line 14, "each" should read --each of--.

COLUMN 20

Line 24, "Example 4" should read --Example 5--.
    Line 25, "1,6-bi[2-" should read --1,6-bis[2- --.
    Line 36, "safetylight" should read --safety light--.

COLUMN 21

Line 6, "plan" should read --plain--.
    Line 64, "safetylight" should read --safety light--.
    Line 67, "little" should be deleted.

UNITED STATES PATENT AND TRADEMARK OFFICE
CERTIFICATE OF CORRECTION

PATENT NO. : 5,064,744

DATED : November 12, 1991

INVENTOR(S) : TETSURO FUKUI, ET AL.

It is certified that error appears in the above-identified patent and that said Letters Patent is hereby corrected as shown below:

<u>COLUMN 22</u>

Line 29, "having" should be deleted.
    Line 40, "heat developable" should read
          --heat-developable--.

Signed and Sealed this

Eleventh Day of January, 1994

BRUCE LEHMAN

*Attest:*

*Attesting Officer*     *Commissioner of Patents and Trademarks*